US006442063B2

(12) United States Patent
Hartmann

(10) Patent No.: US 6,442,063 B2
(45) Date of Patent: Aug. 27, 2002

(54) INTEGRATED MEMORY HAVING MEMORY CELLS WITH MAGNETORESISTIVE MEMORY EFFECT

(75) Inventor: Udo Hartmann, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/885,554

(22) Filed: Jun. 20, 2001

(30) Foreign Application Priority Data

Jun. 20, 2000 (DE) .......................... 100 30 234

(51) Int. Cl.⁷ .......................... G11C 11/02; G11C 17/02
(52) U.S. Cl. ................ 365/158; 365/96; 365/97
(58) Field of Search .................. 365/96, 97, 158, 365/171, 173

(56) References Cited

U.S. PATENT DOCUMENTS

| 4,283,774 A | 8/1981 | Schwartz et al. .............. 365/8 |
| 5,912,579 A | 6/1999 | Zagar et al. .................. 327/526 |
| 5,936,882 A * | 8/1999 | Dunn .......................... 365/158 |
| 6,054,330 A | 4/2000 | Phipps et al. .................. 438/3 |
| 6,055,179 A * | 4/2000 | Koganei et al. ............. 365/158 |

FOREIGN PATENT DOCUMENTS

| DE | 20 17 642 | 9/1980 |
| DE | 199 14 488 C1 | 5/2000 |
| EP | 0 049 512 | 4/1982 |
| JP | 0 260310 | 9/1994 |
| WO | WO 99/14760 | 3/1999 |

* cited by examiner

*Primary Examiner*—Son Luu Mai
(74) *Attorney, Agent, or Firm*—Laurence A. Greenberg; Werner H. Stemer; Gregory L. Mayback

(57) ABSTRACT

The integrated memory has memory cells with a magnetoresistive memory effect connected to column lines and row lines. Each of the memory cells is respectively wired between one of the column lines and one of the row lines. They are constructed such that they can be disconnected from the respective column line and/or row line by conducting a given current through the respective memory cell. It is thus possible to achieve a relatively small outlay for repairing a memory in the event of a defect of a memory cell.

11 Claims, 2 Drawing Sheets

INTEGRATED MEMORY HAVING MEMORY CELLS WITH MAGNETORESISTIVE MEMORY EFFECT

BACKGROUND OF THE INVENTION

FIELD OF THE INVENTION

The invention lies in the integrated technology field and relates, more specifically, to an integrated memory having cells with a magnetoresistive memory effect. Each of the memory cells is connected between one of several column lines and one of several row lines.

Memory cells with a magnetoresistive effect generally comprise ferromagnetic layers of a modifiable condition for storing data signals. This type of memory effect is generally known as the GMR (Giant Magnetoresistive) effect or the TMR (Tunneling Magnetoresistive) effect. The electrical resistance of such a memory cell depends on the magnetization in the ferromagnetic layers.

Integrated memories having memory cells of this type—also referred to as so-called MRAM memories—are often constructed like integrated DRAM memories. Generally, these memories comprise a cell arrangement with substantially parallel row lines and column lines, whereas the row lines customarily run transverse to the column lines.

International PCT publication WO 99/14760 (corresponding to commonly assigned, copending U.S. application Ser. No. 09/528,159) describes an MRAM memory of this type. There, each of the memory cells is wired between one of the row lines and one of the column lines and electrically connected to the respective column line and row line. The memory cells with a magnetoresistive effect are thus more highly resistive than the row lines and column lines. The column lines are connected to a read amplifier for reading a data signal of one of the memory cells. Reading is accomplished by measuring the detectable current on the column line.

In an MRAM memory of that type, there are no diodes or transistors such as are provided in a DRAM memory for connecting the memory cells to the respective column lines in dependence upon the addressing for reading purposes. This brings particular advantages given a geometric arrangement of the memory cells. In particular, it is possible to save space in the arrangement of the memory cells by using a stack arrangement of the cells.

Owing to influences that are conditional to production, such as processing fluctuations, or as a result of aging, it is possible that individual memory cells may exhibit an undesirable, relatively low resistance and may thus be defective. Connected column lines and row lines are substantially shorted by way of such defective cells. Such shorts influence additional memory cells along this respective column line or row line. Furthermore, as a result of a short caused by one of the memory cells, other memory cells along affected lines can no longer be tested in a functional test. When a memory with a defective cell is repaired, the problem cannot be eliminated by replacing a single affected row line or column line, since the functioning of memory cells of the other affected line is still impaired due to the short. It is therefore necessary to replace both affected lines of a defective memory cell in this case.

SUMMARY OF THE INVENTION

The object of the present invention is to provide a integrated memory having memory cells with magnetoresistive memory effect which overcomes the above-noted deficiencies and disadvantages of the prior art devices and methods of this general kind, and with which the outlay for repairing the memory in the event of a defect of a memory cell which triggers a short between a row line and a column line can be reduced. with the above and other objects in view there is provided, in accordance with the invention, an integrated memory, comprising:

a plurality of column lines and a plurality of row lines;
a plurality of memory cells with a magnetoresisitve memory effect; and
electrical connections formed between and connecting the memory cells each to a respective one of the column lines and to a respective one of the row lines, and wherein at least one of the electrical connections is configured to be severed by a current flow through the memory cell, whereby the electrical connection is interrupted.

In other words, the object of the invention are achieved by an integrated memory with magnetoresistive memory cells that are respectively wired between one of several column lines and one of several row lines and electrically connected to the respective column line and row line. The memory cells are configured so as to be disconnectible from the respective column line and/or row line by means of a current flow through the respective memory cell, thereby interrupting the respective electrical connection.

In the inventive integrated memory, when defective memory cells emerge which trigger a short between the respective connected row line and column line, it is possible to disconnect these so as to interrupt the respective electrical connection. The short between the affected row line and column line is thus interrupted. The column line and row line connected to a defective memory cell, and the memory cells connected to these, are therefore no longer affected by the short. The column line and row line that are connected to a defective memory cell can continue to be used for a normal operation or a test operation of the integrated memory, for example. The outlay for disconnecting the memory cell is relatively small. On principle, no lines need to be replaced.

The integrated memory advantageously comprises redundant memory cells for repairing defective cells, which are combined into at least one redundant row line and/or redundant column line which can replace regular lines having defective memory cells per address. In this process, the integrated memory is tested using an external testing device, and the redundant elements are then programmed using what is known as a redundancy analysis. A redundant circuit comprises programmable elements, for instance in the form of programmable fuses, which serve for storing the address of a line that must be replaced.

To repair the integrated memory in the event of a defective memory cell, it suffices to replace only one of the affected lines by a redundant line. Since the short in the defective memory cell is interrupted, the other affected lines can continue operating. The repair outlay can be advantageously reduced in this way.

If the integrated memory comprises several redundant row lines and column lines, in the event of a defective memory cell, it is possible to proceed with a functional test of the remaining memory cells, for instance along the connected row line, if the defective memory cell is first disconnected from the affected row line. In this way, all memory cells of the integrated memory can be tested even if defective cells should meanwhile emerge. The advantage of this is that a purposeful optimized programming of the redundant lines can be carried out by means of a subsequent redundancy analysis. Since the number of redundant lines is usually limited, the production yield of integrated memories can be increased by these means.

In accordance with an added feature of the invention, the current flow for disconnecting one of the memory cells has a higher current intensity than a rated current flow for reading data signals from or for writing data signals into a respective one of the memory cells. The current flow for disconnecting a defective memory cell is, by way of example, generated by a current source that is connected from the outside. An overvoltage limit is thus expediently defined, so that a predetermined voltage is not exceeded when the elevated current is injected.

In accordance with an additional feature of the invention, electrical interconnects are respectively provided between the memory cells and each connected column line and/or between the memory cells and each connected row line. The interconnects comprise a rupture joint which can be severed by the current flow for disconnecting a defective memory cell. The rupture joint is achieved by a tapering of the width of the respective interconnect and thus forming a fuse link. The tapering is constructed such that the respective interconnect is separated by the current flow for disconnecting the defective memory cell.

In accordance with a concomitant feature of the invention, the memory cells comprise an electrically disconnectible material which is wired between the memory cells and the respective column line and/or row line. This material is constructed such that the current flow for disconnecting a defective memory cell interrupts the electrical connection between the memory cell and one or both of the two connected lines. The disconnectible material is expediently layered onto the memory cells.

Other features which are considered as characteristic for the invention are set forth in the appended claims.

Although the invention is illustrated and described herein as embodied in an integrated memory having memory cells with a magnetoresistive memory effect, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
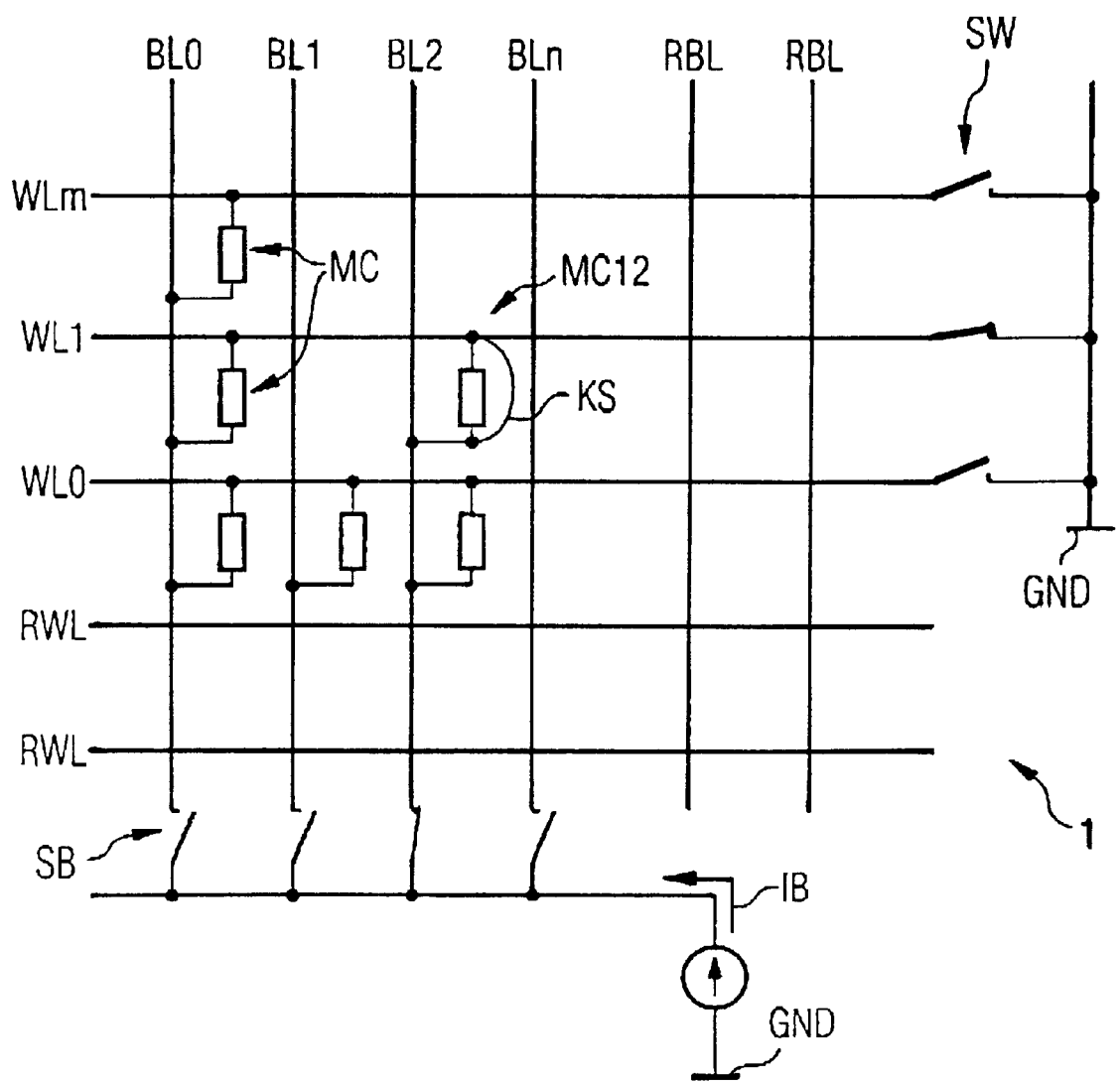
FIG. 1 is a circuit schematic of the integrated memory with magnetoresistive memory cells according to the invention.

Referring now to the figures of the drawing in detail and first, particularly, to FIG. 1 thereof, there is seen an exemplary embodiment of an inventive memory having memory cells MC with a magnetoresistive memory effect. Any known GMR/TMR elements are suitable as the memory cells, provided they exhibit higher impedance than the column lines (here referenced bit lines BL0 to BLn) and the row lines (here referenced word lines WL0 to WLm). The memory here comprises an exemplary number of word lines and bit lines. The memory cells MC, which are arranged in a matrix-type memory cell field 1, are each wired between one of the bit lines BL0 to BLn and one of the word lines WL0 to WLm.

For reading a data signal from one of the memory cells MC, the corresponding bit line is connected to a non-illustrated read amplifier. The relevant word line is actuated for reading information that is stored in a memory cell. To this end, it is charged with a predetermined potential, so that a current flow arises through the memory cell that is to be read out. All other word lines are set to reference potential. For reading out a data signal, the bit line connected to the memory cell being read out is connected to a corresponding read amplifier, which detects this current flow.

The memory cell MC12 represented in FIG. 1 is connected to the word line WL1 and the bit line BL2. It is assumed here that the memory cell MC12 is defective. The bit line BL2 and the word line WL1 are shorted via the memory cell MC12, this being represented schematically in FIG. 1 by a short-circuit arc KS. If the short persists during a normal operation of the memory, a proper read or write operation cannot occur in select memory cells along the word line WL1 or the bit line BL2. In that case, the current flow for reading or writing data signals is superimposed by the current flow that is brought about by the short in the memory cell MC12.

The memory cell MC12 according to the invention is constructed such that it can be disconnected from the bit line BL2 and/or the word line WL1 by means of the current IB. The current IB is provided by an external source and is higher than a current for reading or writing a data signal. In this way, the shorted electrical connection between the bit line BL2 and the word line WL1 can be interrupted. The memory cell MC12 is thus suitably addressed by the switches SB and SW. The current source for generating the current IB and the word line WL1 are respectively connected to a reference potential GND of the memory.

The memory cells MC of the memory cell field 1 are operationally tested in a functional test. If a defective memory cell MC is detected, it can be disconnected as described above. The memory cell field 1 can be completely tested without an undesirable short-circuit current arising. Given the emergence of defective memory cells MC, affected word lines WL0 to WLm or affected bit lines BL0 to BLn can be replaced by redundant word lines RWL or redundant bit lines RBL, respectively. By virtue of the complete testing of the memory field 1, a complete redundancy analysis can be carried out, with the aid of which a purposeful optimized programming of the redundant word lines RWL and redundant bit lines RBL can occur.

Of course, it is also possible to continue to operate the memory without replacement by a redundant line. But the affected memory cell is defective, which can impair operation. In a repair using a redundant line, only the affected word line or bit line (WL1 or BL2 in FIG. 1) must be replaced.

Figure 2:
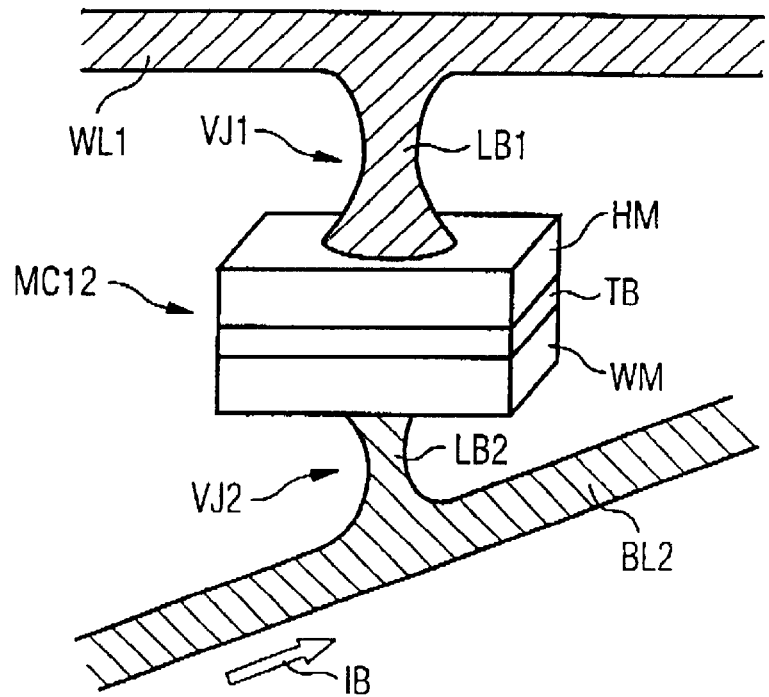
FIG. 2 is a diagrammatic perspective view of an embodiment of a memory cell with a connected row line and column line.

Referring now to FIG. 2, there is shown an exemplary embodiment of the memory cell MC12, which is connected to the word line WL1 and the bit line BL2. An electrical interconnect LB1 is provided between the memory cell MC12 and the word line WL1. An interconnect LB2 is provided between the memory cell MC12 and the bit line BL2. Here, each of the two interconnects LB1 and LB2 expediently comprise a rupture joint, i.e., a fuse, in the form of taperings VJ1 and VJ2, respectively. The widths, that is to say the diameters, of the interconnects LB1 and LB2 are expediently reduced at the tapers. The widths of the interconnects LB1 and LB2 are dimensioned such that they can be severed by the elevated current flow IB in order to disconnect the memory cell MC12, while they are completely functional at the current used for regular read-out and writing. The memory cell MC12 is composed of three layers. It has a hard magnetic layer HM, a tunnel barrier TB, and a soft magnetic layer WM.

Figure 3:
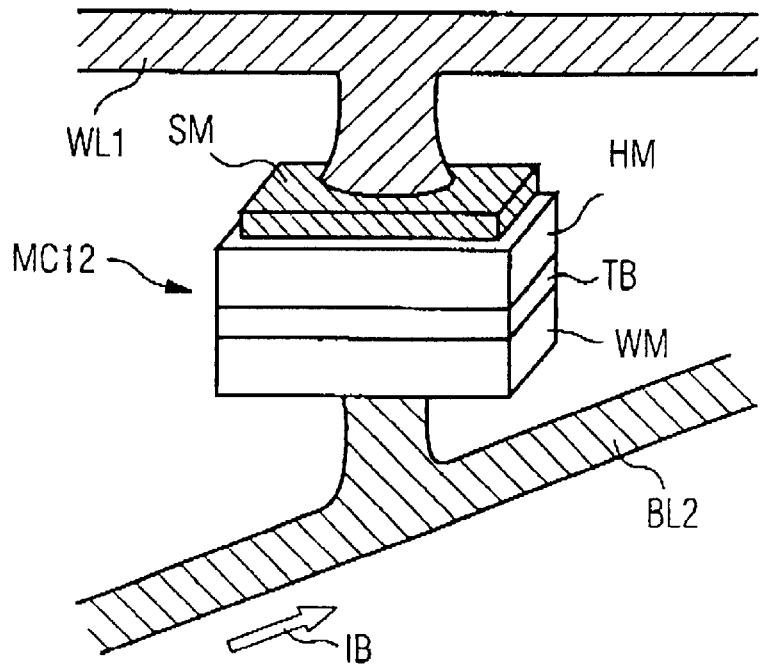
FIG. 3 is a diagrammatic perspective view of an additional embodiment of a memory cell, with a connected row line and column line.

Referring now to FIG. 3, there is shown another embodiment of the memory cell MC12. In this example, a layer material SM which can be electrically disconnected or separated is disposed between the memory cell MC12 and the word line WL1. Additionally or alternatively, the layer material SM can be disposed between the memory cell MC12 and the bit line BL2. As in FIG. 2, the memory cell MC12 is disconnected by means of layer SM by a current IB through the memory cell, thereby interrupting the electrical connection between the memory cell MC12 and the word line WL1.

I claim:

1. An integrated memory, comprising:
   a plurality of column lines and a plurality of row lines;
   a plurality of memory cells with a magnetoresistive memory effect; and
   electrical connections formed between and connecting said memory cells each to a respective one of said column lines and to a respective one of said row lines, and wherein at least one of said electrical connections is configured to be severed by a current flow through said memory cells, whereby said electrical connection is interrupted.

2. The integrated memory according to claim 1, wherein the current flow for disconnecting one of the memory cells is elevated relative to a rated current flow for reading data signals from or for writing data signals into a respective one of said memory cells.

3. The integrated memory according to claim 1, wherein said electrical connection is formed by an electrical interconnect comprising a rupture joint configured to be severed by the current flow for disconnecting the memory cell, and said electrical interconnect is provided between the respective said memory cell and one of said column lines.

4. The integrated memory according to claim 3, wherein said interconnect is formed with a widthwise tapering at said rupture joint.

5. The integrated memory according to claim 1, wherein said electrical connection is formed by an electrical interconnect comprising a rupture joint configured to be severed by the current flow for disconnecting the memory cell, and said electrical interconnect is provided between the respective said memory cell and one of said row lines.

6. The integrated memory according to claim 5, wherein said interconnect is formed with a widthwise tapering at said rupture joint.

7. The integrated memory according to claim 1, wherein said electrical connection is formed by electrical interconnects comprising a rupture joint configured to be severed by the current flow for disconnecting the memory cell, and said electrical interconnects are provided between one of said column lines and the respective said memory cell and between the respective said memory cell and one of said row lines.

8. The integrated memory according to claim 7, wherein said interconnect is formed with a widthwise tapering at said rupture joint.

9. The integrated memory according to claim 1, wherein said electrical connection is an electrically disconnectible material formed at a respective said memory cell and interconnecting said memory cell with one of said column lines or one of said row lines.

10. The integrated memory according to claim 9, wherein said disconnectible material is applied to the respective said memory cell in layers.

11. The integrated memory according to claim 1, which comprises at least one redundant line selected from the group consisting of redundant row lines and redundant column lines for replacing a respective one of said row lines and column lines.

* * * * *